(12) United States Patent
Yamakage

(10) Patent No.: US 11,039,558 B2
(45) Date of Patent: Jun. 15, 2021

(54) COMPONENT MOUNTING LINE PRODUCTION MANAGEMENT SYSTEM AND PRODUCTION MANAGEMENT METHOD

(71) Applicant: FUJI CORPORATION, Chiryu (JP)

(72) Inventor: Yusuke Yamakage, Anjo (JP)

(73) Assignee: FUJI CORPORATION, Chiryu (JP)

(*) Notice: Subject to any disclaimer, the term of this patent is extended or adjusted under 35 U.S.C. 154(b) by 198 days.

(21) Appl. No.: 16/345,851

(22) PCT Filed: Nov. 9, 2016

(86) PCT No.: PCT/JP2016/083297
§ 371 (c)(1),
(2) Date: Apr. 29, 2019

(87) PCT Pub. No.: WO2018/087854
PCT Pub. Date: May 17, 2018

(65) Prior Publication Data
US 2020/0187397 A1     Jun. 11, 2020

(51) Int. Cl.
*H05K 3/30* (2006.01)
*H05K 13/02* (2006.01)
(Continued)

(52) U.S. Cl.
CPC ......... *H05K 13/02* (2013.01); *H05K 13/0409* (2018.08); *H05K 13/0419* (2018.08); *H05K 13/086* (2018.08); *H05K 13/0857* (2018.08)

(58) Field of Classification Search
CPC .............. H05K 13/02; H05K 13/0404; H05K 13/0409; H05K 13/0419; H05K 13/085; H05K 13/0857; H05K 13/086
See application file for complete search history.

(56) References Cited

U.S. PATENT DOCUMENTS 10,820,459 B2 * 10/2020 Kondo ............... H05K 13/0452
10,871,760 B2 * 12/2020 Furuichi ............. H05K 13/083
(Continued)

FOREIGN PATENT DOCUMENTS

EP    2 874 480 A1    5/2015
EP    3 001 787 A1    3/2016
(Continued)

OTHER PUBLICATIONS

International Search Report dated Feb. 14, 2017 in PCT/JP2016/083297 filed on Nov. 9, 2016.

*Primary Examiner* — Paul D Kim
(74) *Attorney, Agent, or Firm* — Oblon, McClelland, Maier & Neustadt, L.L.P.

(57) ABSTRACT

An optimization processing computer, before production starts, sends a production job on which optimization processing was performed but is incomplete to each component mounter, causes an automatic exchanging device to operate so as to change the feeder arrangement of each component mounter to a feeder arrangement specified in the production job, then causes each component mounter to operate so as to start production. After production is started, optimization processing on the production job is continued by the optimization processing computer, and during production, an updated production job for which optimization has progressed is acquired from the optimization processing computer so as to update the production job being executed by each component mounter, then the automatic exchanging device is operated so as to change the feeder arrangement of each component mounter to a feeder arrangement specified in the production job, then production continues.

7 Claims, 10 Drawing Sheets

(51) Int. Cl.
  *H05K 13/04*    (2006.01)
  *H05K 13/08*    (2006.01)

(56) References Cited

U.S. PATENT DOCUMENTS

| | | |
|---|---|---|
| 2006/0229758 A1 | 10/2006 | Maenishi et al. |
| 2016/0114987 A1 | 4/2016 | Mizuno et al. |
| 2019/0053408 A1* | 2/2019 | Kondo ............... H05K 13/0495 |
| 2020/0100410 A1* | 3/2020 | Ushii ................. H05K 13/086 |

FOREIGN PATENT DOCUMENTS

| | | |
|---|---|---|
| JP | 2002-171097 A | 6/2002 |
| JP | 2003-283198 A | 10/2003 |
| JP | 2004-79962 A | 3/2004 |
| JP | 2008-153469 A | 7/2008 |
| JP | 2008-218970 A | 9/2008 |
| JP | 2009-49440 A | 3/2009 |
| WO | WO 2014/188520 A1 | 11/2014 |

* cited by examiner

COMPONENT MOUNTING LINE PRODUCTION MANAGEMENT SYSTEM AND PRODUCTION MANAGEMENT METHOD

TECHNICAL FIELD

The present disclosure relates to a component mounting line production management system and production management method for a component mounting line provided with a production job optimization device configured to perform processing to optimize a production job (production program) that is executed on each component mounter of the component mounting line.

BACKGROUND ART

Conventionally, to improve production efficiency of a component mounting line, optimization is performed on production jobs executed by each of multiple component mounters. Conventional optimization methods, as disclosed in patent literature 1 (JP-A-2002-171097), patent literature 2 (JP-A-2008-218970), and patent literature 3 (JP-A-2004-79962), involve optimizing the mounting order of components to be mounted on a circuit board, and optimizing an arrangement of feeders set on the component mounters to minimize the movement distance or movement time of a mounting head (suction nozzle), so as to optimize the production job to achieve maximum production efficiency.

Generally, because a component mounting line mounts many components on a circuit board using multiple component mounters, there are a huge number of combinations of feeder arrangements and mounting orders for the multiple component mounters for which optimization processing is to be performed. Therefore, it takes a long time to complete optimization processing for a production job for multiple component mounters on a personal computer. Depending on the calculating ability of the personal computer on which optimization processing is being performed, because it may take, for example, a whole day to complete optimization processing, as disclosed in patent literature 4 (JP-A-2003-283198) and patent literature 5 (JP-A-2009-49440), there are cases in which a user ends optimization processing while it is still being performed and performs production using the feeder arrangement specified for the job at the point at which optimization processing was ended.

CITATION LIST

Patent Literature

Patent literature 1: JP-A-2002-171097
Patent Literature 2: JP-A-2008-218970
Patent literature 3: JP-A-2004-79962
Patent literature 4: JP-A-2003-283198
Patent literature 5: JP-A-2009-49440

BRIEF SUMMARY

Technical Problem

However, if production is started with a production job using an unfinished optimization, production is being performed in a state in which production efficiency is low, which increases production time, thereby increasing the time until production is completed. However, if one waits until optimization processing for the job has completely finished before starting production, the production start time is delayed, which also results in increased time until production is completed.

Solution to Problem

To solve the above problem, disclosed herein is a component mounting line production management system for a component mounting line configured to produce component-mounted boards using multiple component mounters arranged along a conveyance path on which a circuit board is conveyed, the component mounters picking up a component supplied from a feeder using a suction nozzle and mounting the electronic component on the circuit board, the system including: a production job optimization device configured to perform processing to optimize a production job executed by each of the component mounters in the component mounting line; an automatic exchanging device configured to automatically exchange feeders set on each of the component mounters in accordance with a feeder arrangement specified in the production job; and a production management device configured to acquire the production job on which optimization processing was performed by the production job optimization device, send the production job to each of the component mounters, and cause the automatic exchanging device to operate so as to change the feeder arrangement of each of the component mounters to the feeder arrangement specified in the sent production job and then cause each of the component mounters to operate, wherein the production management device is configured to acquire a production job for which optimization is incomplete from the production job optimization device before starting production, send the production job for which optimization is incomplete to each of the component mounters, and start production with the feeder arrangement specified in the production job for which optimization is incomplete, the production job optimization device is configured to continue optimization processing of the production job after production has been started, and the production management device is configured to acquire a latest production job for which optimization has progressed during production from the production job optimization device during production, update the production job being executed at each of the component mounters, cause the automatic exchanging device to operate so as to change the feeder arrangement of each of the component mounters to the feeder arrangement specified in the latest production job, then continue production.

That is, the production job optimization device, before starting production, at a point at which optimization processing has been performed on the production job to a certain extent, sends the production job for which optimization is incomplete to each of the component mounters and starts production, continues optimization processing of the production job after production has started, then, sends an updated production job for which optimization has progressed during production to each of the component mounters so as to update the production job being executed by each of the component mounters, causes the automatic exchanging device to operate so as to change the feeder arrangement of each of the component mounters to the feeder arrangement specified in the production job, then continues production. Accordingly, by starting production using a production job for which optimization is incomplete without waiting for optimization processing of the production job to complete, production is started earlier, then, by updating to the latest production for which optimization has progressed during production and then continuing production, the production efficiency is improved during production, leading to a decrease in the production time, thereby enabling both demands of starting production early and of shortening production time to be satisfied at the same time.

In this case, each component mounter may be configured to exchangeably hold the suction nozzle, include a suction nozzle exchanging unit, which houses exchange-use suction nozzles in a removable manner, next to the feeders, and perform automatic exchange of the suction nozzle to and from the suction nozzle exchanging unit in accordance with a suction nozzle arrangement specified in the production job, and the automatic exchanging device may be configured to perform automatic exchange of the feeders and the suction nozzle exchanging units set in each of the component mounters in accordance with the feeder arrangement and the suction nozzle arrangement specified in the production job. Accordingly, when the production job is updated during production, in addition to the feeder arrangement, the suction nozzle arrangement can be changed automatically in accordance with the updated production job.

Further, the production job optimization device may be configured to calculate information related to a production efficiency improvement result and display the result on a display device when the production job has been updated to the latest production job based on a degree of progress of optimization of the production job after production has been started. Accordingly, during production, an operator can check the information related to the production efficiency improvement result displayed on the display device, estimate a period at which the production efficiency improvement result will be large, and update the production job accordingly.

Alternatively, the production job optimization device may be configured to determine the timing to update the production job being executed by each of the component mounters based on the degree of progress of the optimization processing of the production job of the production job optimization device after production has been started, and send the production job optimized to that point to the production management device. Accordingly, during production, the production job optimization device can determine a period for which the production efficiency improvement result due to updating the production job will be large and automatically update the production job accordingly.

For example, during production, there are cases in which an operating condition of a specific component mounter in the component mounting line changes such as due to pickup conditions changing due to a pickup rate of the specific component being bad, or such as slowing down a transport speed of a component because of a problem with the transport weight of a component picked up by a suction nozzle, and in such cases the tact time for that specified component mounter worsens, which destroys the line balance, thereby lowering productivity and increasing production time.

Thus, the production management device may be configured to monitor an operating state (for example, a component pickup rate, a mounting defect occurrence rate) of each of the component mounters during production, and in a case in which an operating condition of any of the component mounters has changed (for example, the transport speed of a component picked up by a suction nozzle, a type of suction nozzle), to send the post-change operating condition to the production job optimization device, and the production job optimization device may be configured to perform optimization processing of the production job using the acquired post-change operating condition, and the production management device may be configured to acquire the production job optimized using the post-change operating condition from the production job optimization device during production and update the production job being executed by each of the component mounters. Accordingly, even in a case in which an operating condition of any of the component mounters changes during production, optimization processing of the production job is performed using the post-change operating condition by the production job optimization device, the optimized production job is sent to each of the component mounters such that the production job is updated, thus, even in a case in which an operating condition of any of the component mounters changes during production, the line balance is not destroyed, and production efficiency does not worsen.

DESCRIPTION OF EMBODIMENTS

Figure 1:
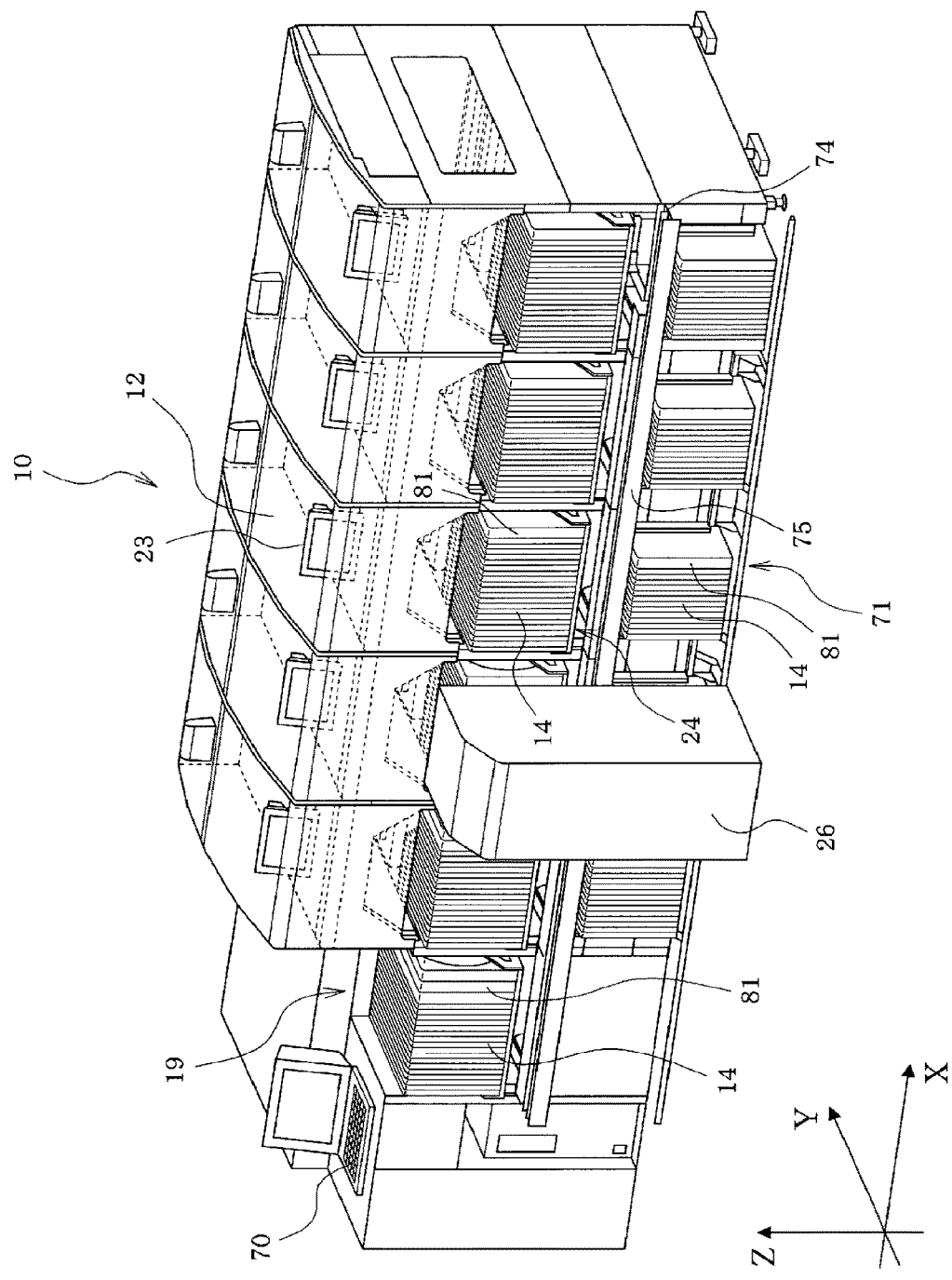
FIG. 1 is a perspective view showing the overall configuration of a component mounting line of a first embodiment.

A first and a second embodiment are described below.

First Embodiment

A first embodiment will be described with reference to FIGS. 1 to 8. First, the configuration of component mounting line 10 will be described with reference to FIGS. 1 to 6. Component mounting line 10 is configured from multiple component mounters 12 lined up in a row along a conveyance direction (X direction) of circuit board 11, with a solder printer (not shown) for printing solder on circuit board 11, storage device 19 for storing cassette-type feeders 14 (refer to FIG. 4) and suction nozzle exchanging device 81 (refer to FIGS. 5 and 6), and the like being provided on the board loading side of component mounting line 10.

Figure 2:
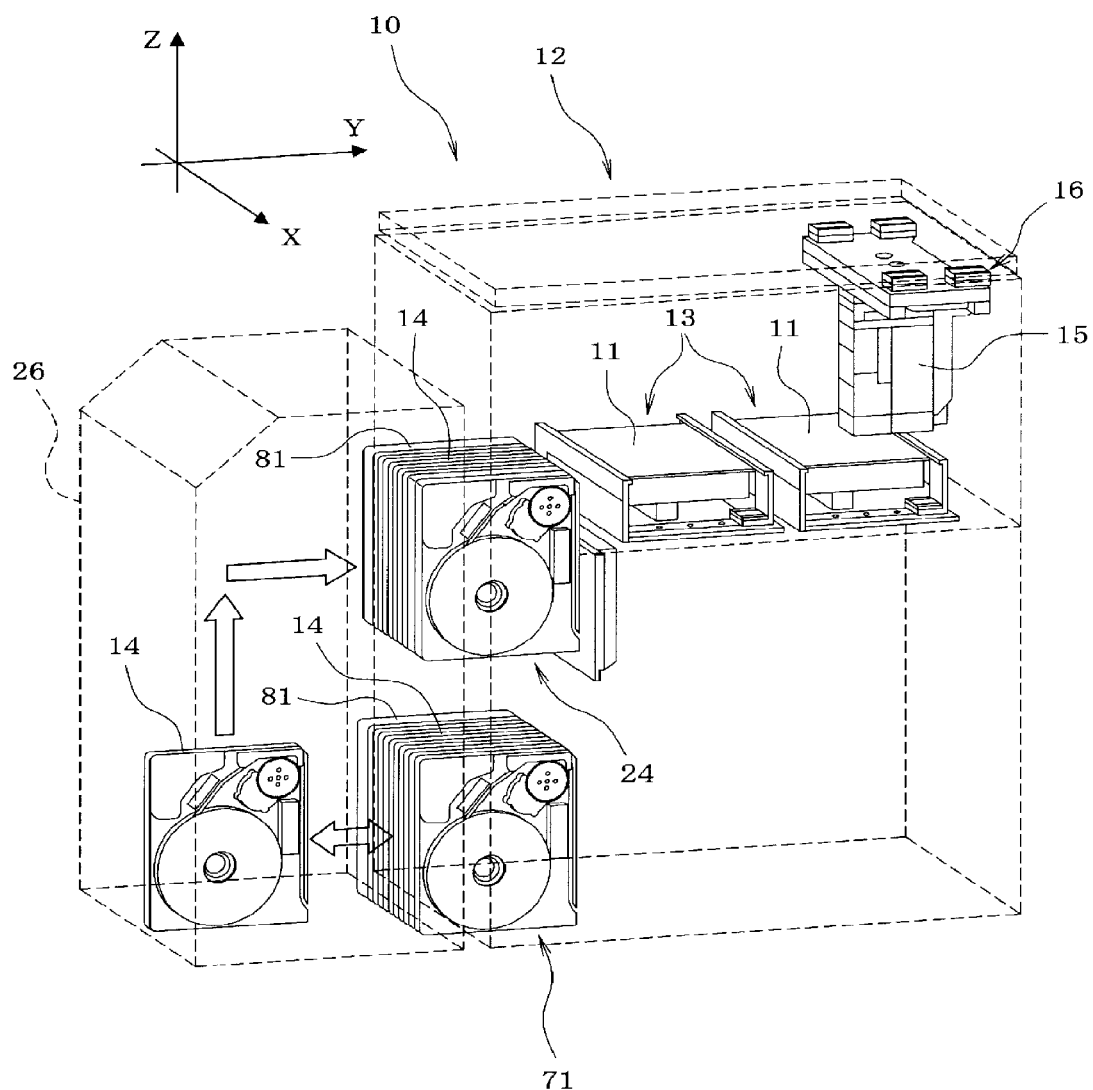
FIG. 2 is a perspective view schematically showing the configuration of the automatic exchanging device and a component mounter.

As shown in FIG. 2, each component mounter 12 is provided with items such as two conveyors 13 that convey circuit board 11, mounting head 15 that holds a suction nozzle (not shown) that picks up a component supplied from cassette-type feeder 14 and mounts the component on circuit board 11, head moving device 16 that moves head 15 in the XY directions (left-right and front-rear directions), and display device 23 such as a liquid crystal display or a CRT.

In each of the component mounters 12 of component mounting line 10, circuit board 11 conveyed from an upstream component mounter 12 is conveyed to a specified position by conveyor 13, the circuit board 11 is clamped in position by a clamp mechanism (not illustrated), a component supplied from cassette-type feeder 14 is picked by the suction nozzle of mounting head 15, moved from the pickup position to an imaging position, and imaged from below by a component imaging camera (not shown) to determine a pickup position deviation amount and the like, thereafter, the pickup position deviation amount is corrected and the component is mounted on the circuit board 11 on conveyor 13 to produce a component-mounted board.

Figure 4:
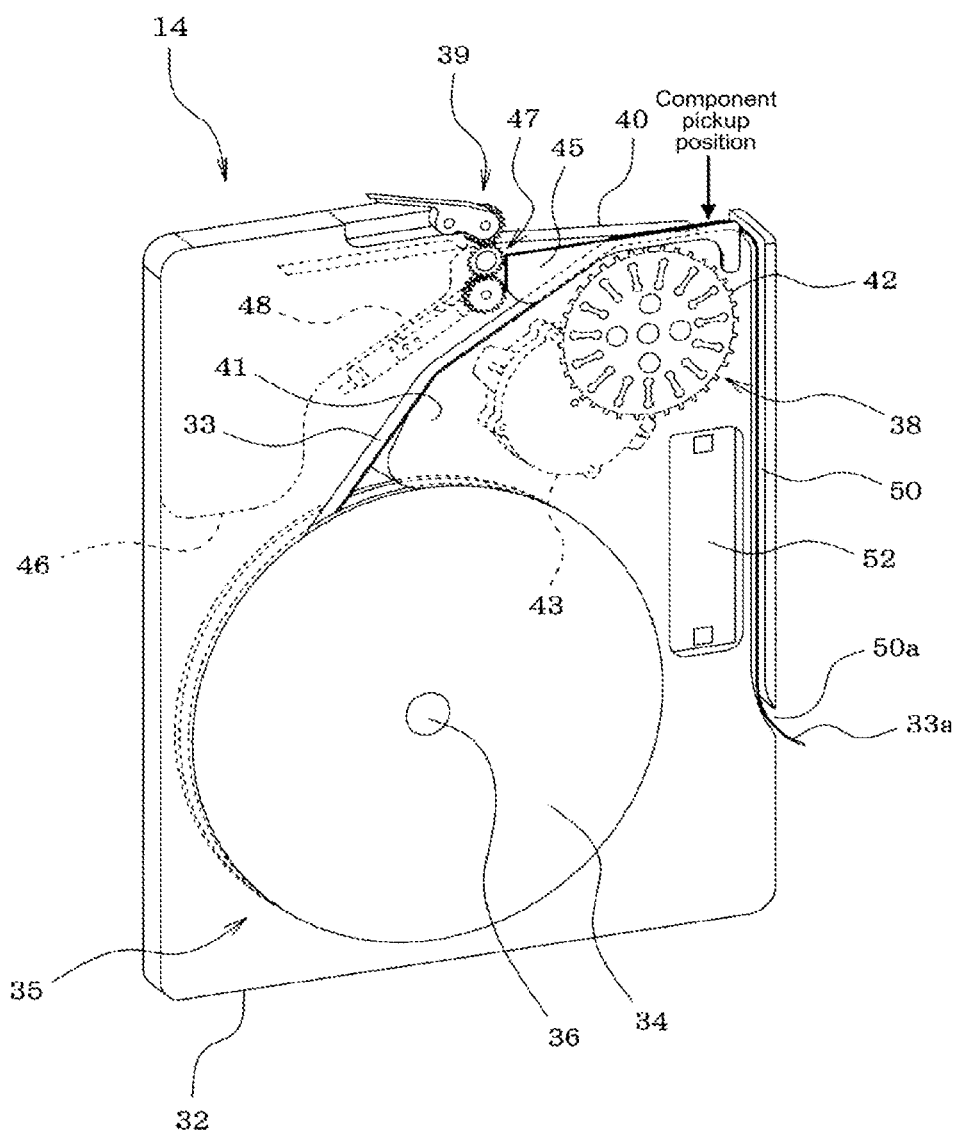
FIG. 4 is a perspective view showing a cassette-type feeder.

Next, the configuration of cassette-type feeder 14 is described with reference to FIG. 4. Cassette-case 32 of cassette-type feeder 14 is formed from transparent or non-transparent plastic or metal plates or the like, and a side section (cover) thereof can be opened and closed. Tape loading section 35, in which tape reel 34 around which component supply tape 33 is wound is loaded in a detachable (exchangeable) manner, is provided inside the cassette case 32. Reel holding shaft 36 that holds tape reel 34 in a rotatable manner is provided in the center of tape loading section 35.

Tape feeding mechanism 38 that feeds component supply tape 33 pulled out from tape reel 34 to a component pickup position, and top film peeling mechanism 39 that peels top film 40 (also known as cover tape) from component supply tape 33 before the component pickup position to expose components in component supply tape 33 are provided inside cassette case 32.

Tape feeding mechanism 38 is formed from sprocket 42 that is provided in the vicinity below the component pickup position, motor 43 that drives sprocket 42 to rotate, and the like, and tape feeding mechanism 38 pitch feeds component supply tape 33 to the component pickup position by engaging the teeth of sprocket 42 with tape feeding holes, which are formed in the edge of one side of component supply tape 33 at a predetermined pitch, and rotating sprocket 42.

Top film peeling mechanism 39 is formed from tape retainer 45 for retaining component supply tape 33 and peeling top film 40 from the top surface of component supply tape 73 before the component pickup position, top film feeding gear mechanism 47 that pulls top film 40 that is peeled by tape retainer 45 in the opposite direction from the tape feeding direction to feed top film 40 into top film collection section 46, which is provided on the top portion of cassette case 32, motor 48 that drives top film feeding gear mechanism 47, and the like.

Waste tape disposal path 50 that guides waste tape 33*a* (in the first embodiment, only the carrier tape from which top film 40 has been peeled), which has passed the component pickup position and from which the components have been removed, downward to dispose of waste tape 33*a* is provided extending downwards at the end section of the tape feeding direction side within cassette case 32, and outlet 50*a* of waste tape disposal path 50 is provided in a position closer to the bottom side than the center of the end surface of the tape feeding direction side of cassette case 32.

Control device 52 that controls motor 43 of tape feeding mechanism 38 and motor 48 of top film peeling mechanism 39 are provided within cassette case 32. In addition, while not shown in the drawings, a connector for communication and power that is connected to the connector for communication and power of component mounter 12 is provided in cassette case 32.

Figure 5:
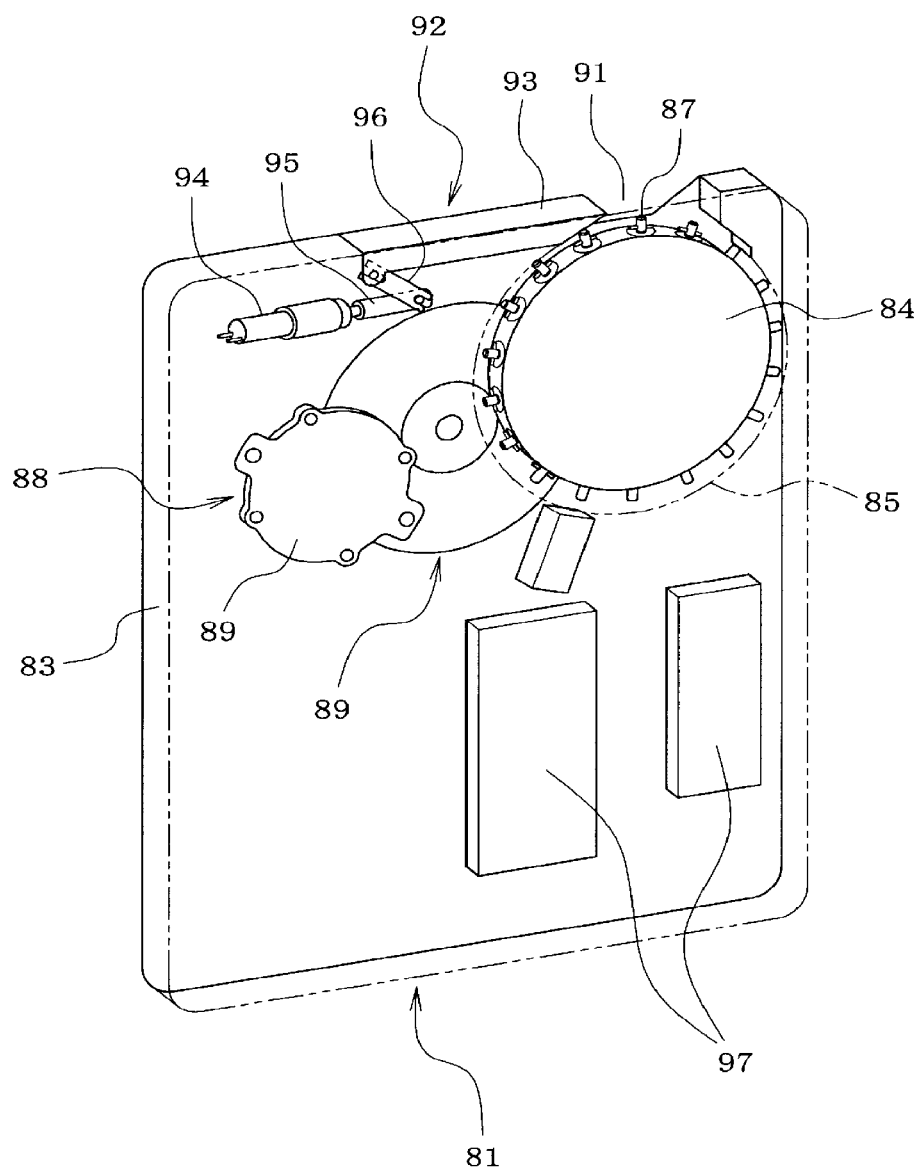
FIG. 5 is a perspective view showing a cassette-type suction nozzle exchanging unit.
Figure 6:
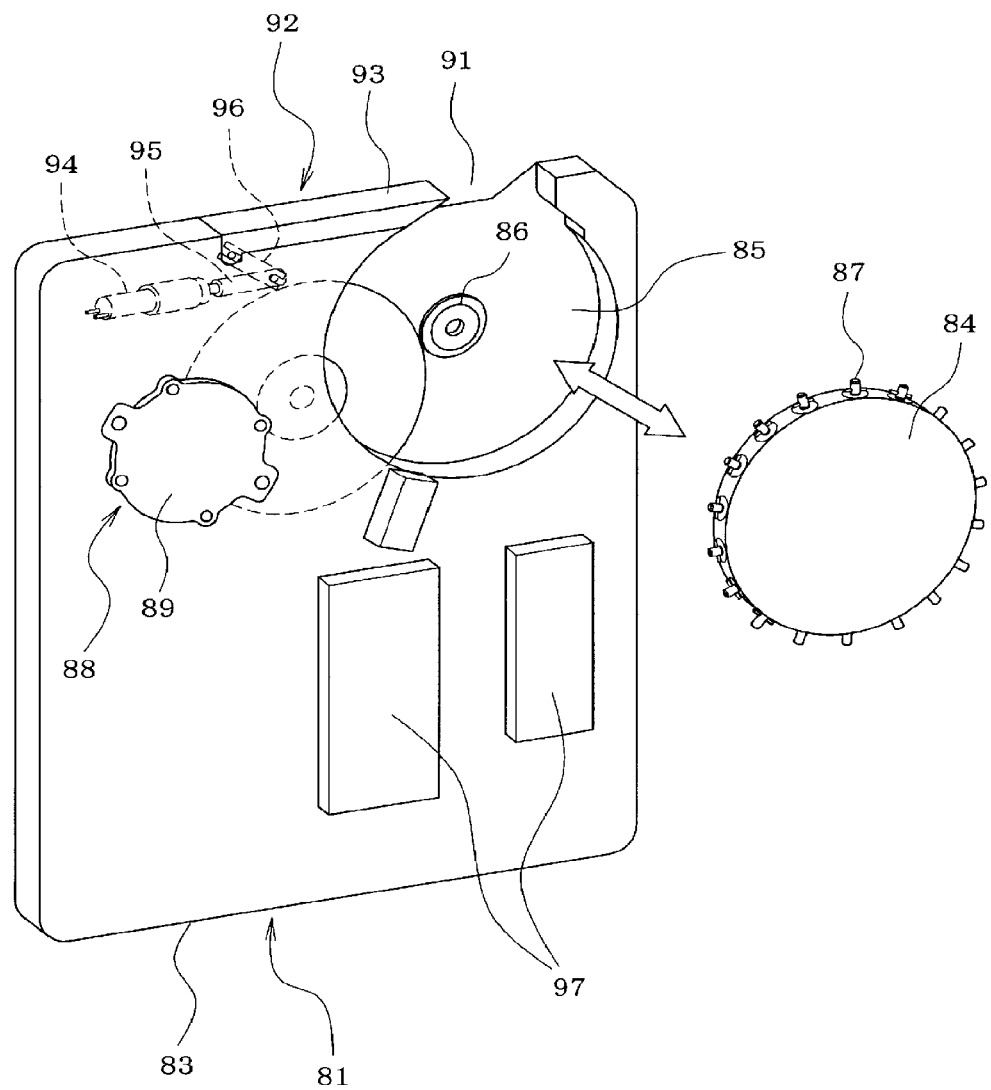
FIG. 6 is a perspective view showing a state with a rotation-type nozzle station removed from the cassette-type suction nozzle exchanging unit.

Next, the configuration of cassette-type suction nozzle exchanging unit 81 will be described with reference to FIGS. 5 and 6. Cassette case 83 of cassette-type suction nozzle exchanging unit 81 is formed of a transparent or opaque plastic plate, a metal plate, or the like, and the side surface section (cover) is capable of opening and closing. A circular recessed nozzle station loading section 85 in which disc-shaped revolving nozzle station 84 is detachably (exchangeably) loaded is provided inside cassette case 83, drive shaft 86 (refer to FIG. 6) is provided facing horizontally in the center of nozzle station loading section 85, and the center section of revolving nozzle station 84 is detachably connected to drive shaft 86 such that transfer of rotation is possible. On the outer circumferential section of revolving nozzle station 84, multiple suction nozzles 87 for exchanging with a suction nozzle of mounting head 15 of component mounter 12 are arranged radially at a specified pitch, and revolving nozzle station 84 is configured to hold the multiple suction nozzles in a detachable manner.

Further, revolving drive device 88 that makes revolving nozzle station 84 revolve is provided inside cassette case 83. Revolving drive device 88 is formed from motor 89 that serves as a drive source, and gear mechanism 90 that transmits the rotation of motor 89 to drive shaft 86.

Nozzle exchange port 91 is formed in a position corresponding to the topmost end (in a direction straight up from the center of revolving nozzle station 84) of revolving nozzle station 84 within the top surface of cassette case 83, and nozzle exchange is performed between revolving nozzle station 84 and mounting head 16 of component mounter 12 through nozzle exchange port 91. Shutter mechanism 92 that opens and closes nozzle exchange port 91 is provided in cassette case 83. Shutter mechanism 92 is configured from shutter plate 93 that slides along nozzle exchange port 91, motor 94 as a drive source, feeding gear 95 that converts rotation of motor 94 into linear motion, and link member 96 that connects feeding gear 95 and shutter plate 93.

When mounting head 16 of component mounter 12 is caused to hold a suction nozzle 87 inside the cassette-type suction nozzle exchanging unit 81 that is set in feeder setting section 24 of component mounter 12, mounting head 12 is moved above nozzle exchange port 91 of suction nozzle exchanging unit 81, and shutter plate 93 of shutter mechanism 92 is subjected to an opening operation to open nozzle exchange port 91. After the revolving nozzle station 84 within suction nozzle exchanging unit 81 is rotated as appropriate such that the suction nozzle 87 to be exchanged this time is positioned in nozzle exchange port 91, a nozzle holder (not shown) of mounting head 15 is lowered, the suction nozzle 87 is held by the nozzle holder of mounting head 15 through nozzle exchange port 33, then the nozzle holder of mounting head 15 is lifted and the suction nozzle 87 is removed from revolving nozzle station 84.

Note that, a configuration may be adopted in which, when returning the suction nozzle that is held on the nozzle holder of mounting head 15 to a vacant slot in revolving nozzle station 84 within the suction nozzle exchanging unit 81, after rotating the revolving nozzle station 84 as appropriate and positioning the vacant slot of revolving nozzle station 84 at nozzle exchange port 33, the nozzle holder of mounting head 15 is lowered and the suction nozzle held by the nozzle holder of mounting head 15 may be returned to the empty slot of revolving nozzle station 84.

Control device 97 that controls motor 89 of revolving drive device 88 and motor 94 of shutter mechanism 92 is provided inside cassette case 83. In addition, while not shown in the drawings, a connector for communication and power that is connected to the connector for communication and power of component mounter 12 is provided in cassette case 83.

As shown in FIG. 1, automatic exchanging device 26 that performs setting and removing of cassette-type feeders 14 to and from feeder setting section 24 of each component 12 is provided on the front side of component mounting line 10. Automatic exchanging device 26 also performs setting and removing of cassette-type suction nozzle exchanging unit 81 to and from feeder setting section of each component mounter 12.

Stock section 71 for stocking multiple feeders 14 and suction nozzle exchanging units 81 to be set on feeder setting section 24 is provided below feeder setting section 24 of each component mounter 12. Automatic exchanging device 26 removes feeders 14 and suction nozzle exchanging units 81 that are exchange targets from feeder setting section 24 of the multiple component mounters 12 and collects them in stock section 71, and removes feeders 14 and suction nozzle exchanging units 81 specified in the production job (production program) from stock section 71 and sets the feeders 14 and suction nozzle exchanging units 81 in the feeder setting section 24 of the multiple component mounters 12.

Guide rail 74 for moving automatic exchanging device 26 in the left-right direction (X direction) along the row of component mounters 12 is provided on the front side of component mounting line 10 so as to extend in the X direction along the entire length of component mounting line 10, and automatic exchanging device 26 moves between storage device 19 at the further upstream end of component mounting line 10 and the furthest downstream component mounter 12. Automatic exchanging device 26 removes a feeder 14 or suction nozzle exchanging unit 81 specified in the production job from storage device 19, transports it to stock section 71 of the specified component mounter 12, and removes a used feeder 14 or suction nozzle exchanging unit 81 from stock section 71 and returns it to storage device 19.

Figure 3:
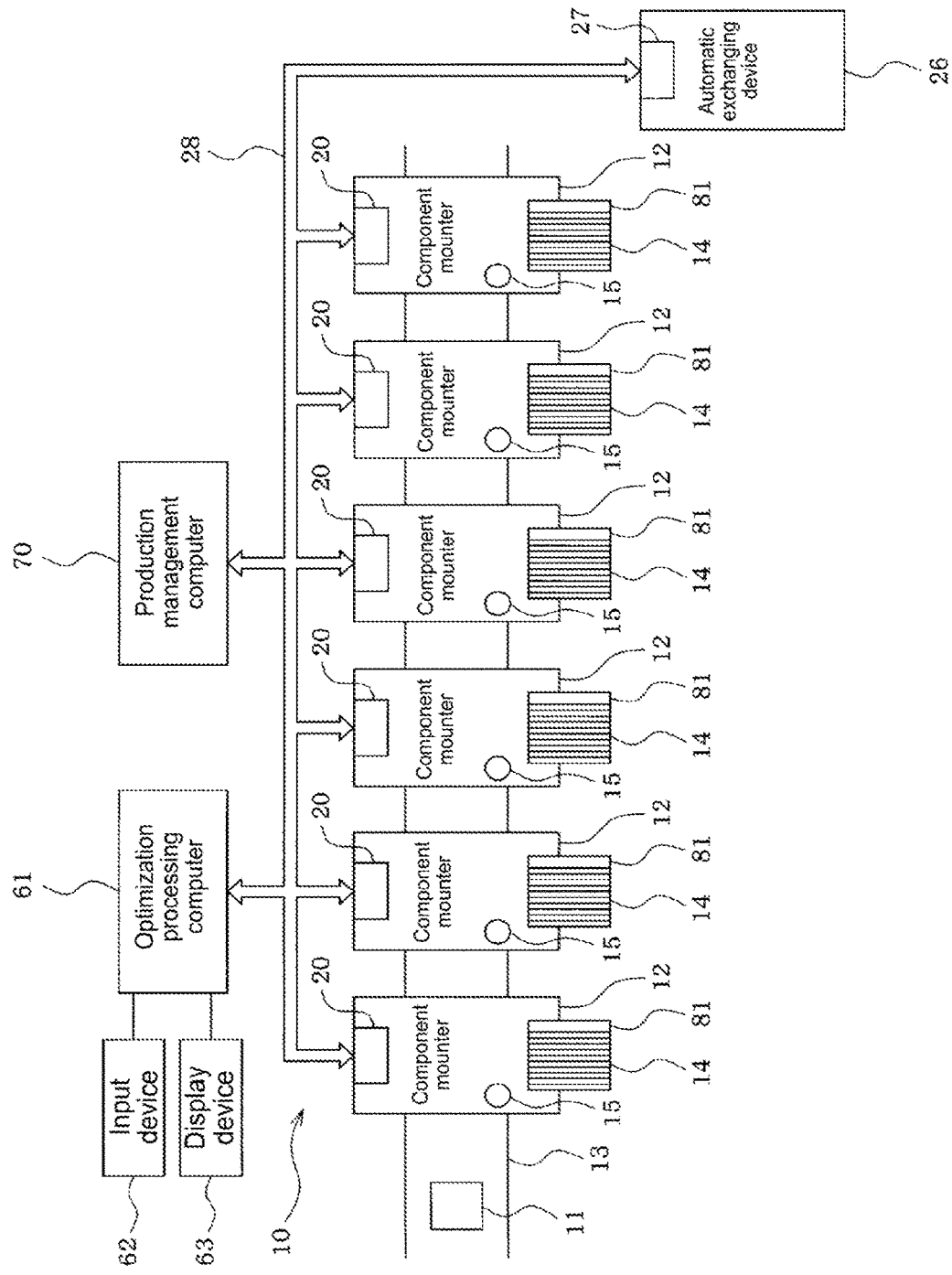
FIG. 3 is a block diagram schematically showing the configuration of a production management system of the component mounting line equipped with an automatic exchanging device.

As shown in FIG. 3, control device 27 of automatic exchanging device 26 and control device 20 of each component mounter 12 of component mounting 10 are connected via network 28 to production management computer 70 (production management device) that manages overall production of component mounting line 10, and operation of automatic exchanging device 26 and operation of each component mounter 12 of component mounting line 10 is managed by production management computer 70. Further, optimization processing computer 61 (production job optimization device) that performs processing to optimize a production job (production program) that is executed by component mounters 12 is connected to network 28. Items such as input device 62 such as a keyboard, mouse, or touchscreen display and display device 63 for displays things like a degree of progress of production job optimization processing are connected to optimization processing computer 61. Optimization processing computer 61, before production is started, by performing the production job optimization processing program of FIG. 7 that is described later, performs optimization processing of a production job, and continues optimization processing of the production job even after production has started.

Figure 8:
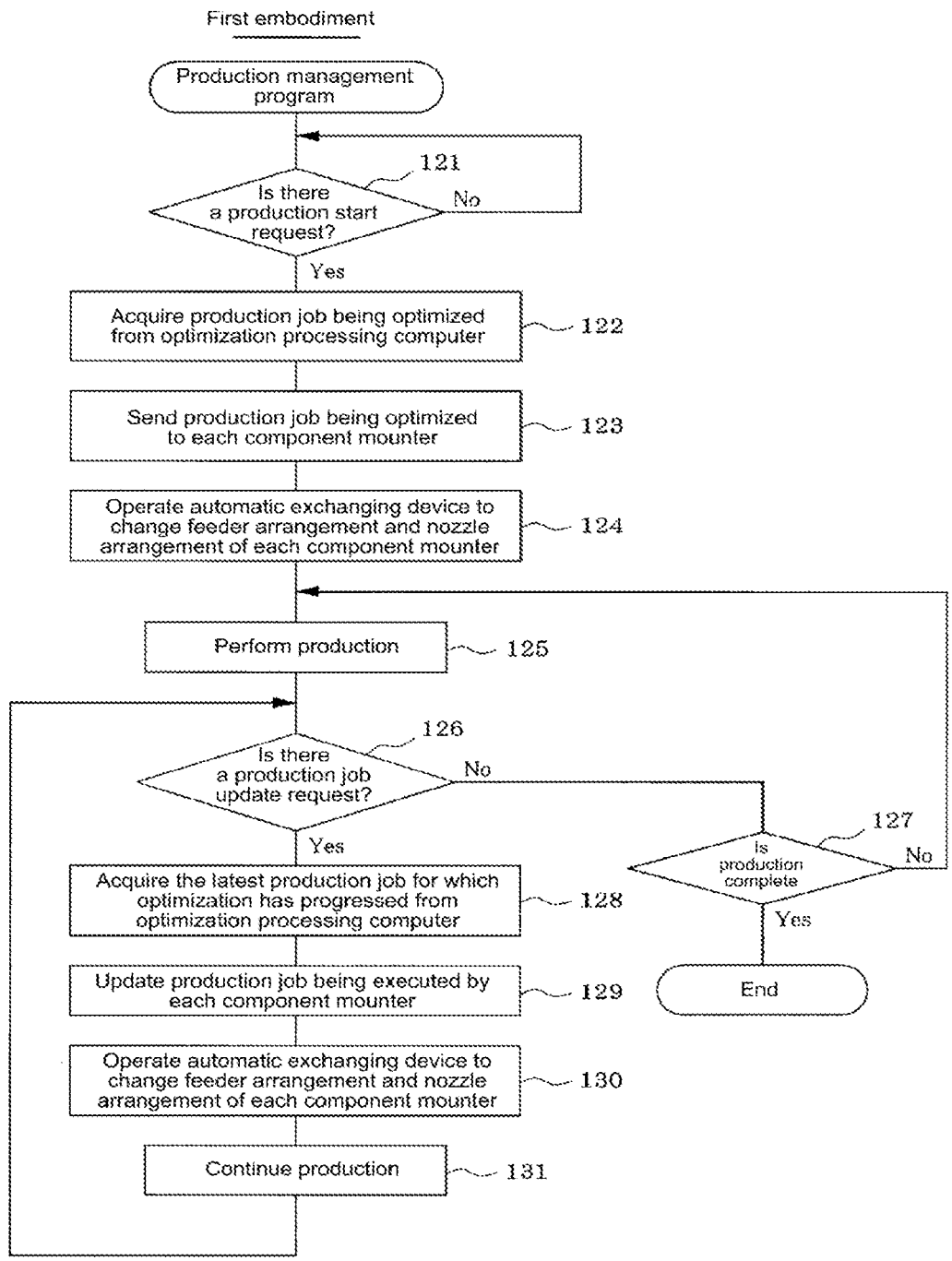
FIG. 8 is a flowchart showing a flow of processing of a production management program of the first embodiment.

Production management computer 70, by performing the production management program of FIG. 8 that is described later, acquires a production job optimized at optimization processing computer 61 via network 28, sends the optimized production job to control device 20 of each component mounter 12, and causes automatic exchanging device 26 to operate so as to change the feeder arrangement and suction nozzle arrangement of each component mounter 12 to arrangements specified in the production job. Control device 20 of each component mounter 12 operates items according to a production job received from optimization processing computer 61, moving mounting head 15 along a path from a component pickup position to a component imaging position to a component mounting position so as to pick up a component supplied from a feeder 14 using a suction nozzle of mounting head 15, imaging the picked up component using the component imaging camera to recognize the component pickup position deviation amount and the like, and mounting the component on circuit board 11, then repeating those operations to produce a circuit board 11 with a specified quantity of components mounted on it.

In the first embodiment, production management computer 70 acquires a production job for which optimization is incomplete from optimization processing computer 61 before production starts, sends the acquired production job to each component mounter 12, and starts production with the feeder arrangement and suction nozzle arrangement specified in the acquired production job; optimization processing computer 61 continues optimization processing of the production job after production has started, and production management computer 70 acquires a latest job for which optimization has progressed during production from optimization processing computer 61, updates the production job being executed on each component mounter 12, causes automatic exchanging device 26 to operate so as to change the feeder arrangement and suction nozzle arrangement of each component mounter 12 to the arrangements specified in the production job, then continues production. Here, the feeder arrangements and suction nozzle arrangements are changed in order from the component 12 at the upstream side of component mounting line 10 such that production does not stop during updating of the production job, or such that production stoppage time is minimized.

Next, the processing of the production job optimization processing program of FIG. 7 performed by optimization processing computer 61 will be described. The production job optimization processing program of FIG. 7 is started before production starts, and continues after production has started until production ends or optimization is complete.

Figure 7:
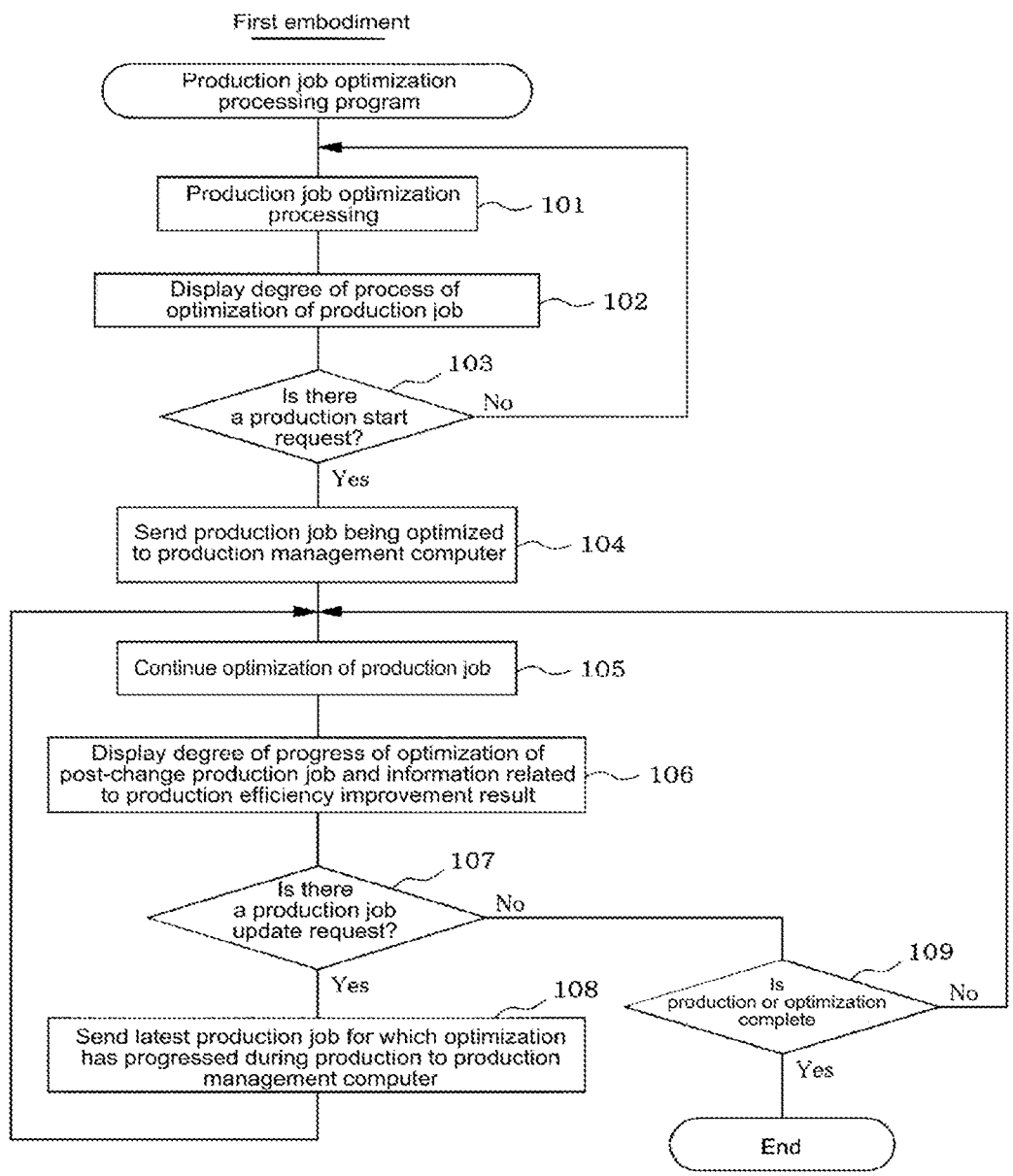
FIG. 7 is a flowchart showing a flow of processing of a production job optimization program of a first embodiment.

When the production job optimization processing program of FIG. 7 is started, first, in step 101, optimization processing of the production is performed, then, in step 102, the degree of progress of optimization of the production job is displayed on display device 63. Then, proceeding to step 103, it is determined whether there has been a production start request. For example, an operator may look at the degree of progress of optimization of the production job displayed on display device 63, and when the degree of progress reaches a point at which the operator determines that production can be started, the operator may input a production start request using input device 62; alternatively, before production, an operator may set a target value for the degree of progress of optimization at which to start production using input device 62, and when the degree of progress of optimization of the production job reaches the target value, a production start request may be issued automatically.

In step 103 above, the processing of steps 101 to 103 is repeated until it is determined that there has been a production start request. Then, in step 103, upon determining that there has been a production start request, proceeding to step 104, the production job for which optimization is incomplete is sent to production management computer 70, then, in step 105, optimization processing of the production job is continued, then, in step 106, the degree of progress of optimization for the production job for which production has been started and information related to a production efficiency improvement result in a case in which the production job is updated to the latest production job are displayed on display device 63. Here, information related to a production efficiency improvement result in a case in which the production job is updated to the latest production job is calculated by optimization processing computer 61 based on the degree of progress of optimization of the production job after production has been started. Information related to a production efficiency improvement result, for example, may be a production time (planned production complete time) reduction amount, a tact time reduction amount, a comparison table of tact time or a comparison table of production time (planned production complete time) before and after updating the production job, that is, information that enables an operator to understand how much earlier production will be completed due to updating the production job.

Then, proceeding to step 107, it is determined whether there has been a production job update request. For example, an operator may look at the degree of progress of optimization of the production job after production has started and the information related to a production efficiency increase result in a case in which the production job is updated, which are displayed on display device 63, and upon determining that updating the production job would improve the production efficiency by a given amount (make the production complete time earlier), the operator may use input device 62 to input a production job update request; alternatively, before production, the operator may set a target value for the degree of progress of optimization at which to update the production job using input device 62, and when the degree of progress of optimization of the production job (or a production time reduction amount or the like, or a production efficiency improvement result) reaches the target value, a production job update request may be issued automatically.

In step 107, when it is determined that there is a production job update request, proceeding to step 108, the latest production job for which optimization has progressed during production is sent to production management computer 70. Subsequently, processing of steps 105 to 107 is repeated, optimization processing of the production job is continued, and the degree of progress or the like of optimization of the production job is displayed on display device 63. By this, it is possible to update the production job during production several times.

Further, in step 107, if it is determined that there has not been a production job update request, continuing to step 109, it is determined whether production has been completed and whether optimization has been completed, with steps 105 to 107 being repeated until it is determined that production or optimization has been completed, and production job optimization processing is continued, and in step 109, upon determining that production or optimization has been completed, the program ends.

Next, the processing of production management program of FIG. 8 performed by production management computer 70 will be described. The production management program of FIG. 8 is started before production is started, and first, in step 121, similar to the method of step 103 of FIG. 7, it is determined whether there has been a production start request and processing stands by until the system determines that there has been production start request.

Then, in step 121, when it is determined that there has been a production start request, proceeding to step 122, the production job for which optimization is incomplete is acquired from optimization processing computer 61, then, proceeding to step 123, the production job for which optimization is incomplete is sent to each component mounter 12, then, continuing to step 124, automatic exchanging device 26 is operated to change the feeder arrangement and the suction nozzle arrangement of each component mounter 12 to arrangements specified in the production job, then each component mounter 12 is operated to start production (step 125).

Then, proceeding to step 126, in a similar manner to that step 107 of FIG. 7 above, it is determined whether there has been a production job update request, and if it is determined that there has not been a production job update request, proceeding to step 127, it is determined whether production is complete, and if it is determined that production is incomplete, processing returns to step 126 and production is continued.

Then, in step 126, if it is determined that there has been a production job update request, proceeding to step 128, the latest production job for which optimization progressed during production is acquired from optimization processing computer 61, then, in step 129, the latest production job is sent to each component mounter 12 so as to update the production job being executed by each component mounter 12, then, continuing to step 130, automatic exchanging device 26 is operated so as to change the feeder arrangement and the suction nozzle arrangement of each component mounter 12 to arrangements specified in the production job, then production is continued using the latest job (step 131).

Then, returning to step 126, it is determined whether there has been a production job update request, and the above processing is repeated in accordance with the outcome of that determination. By this, it is possible to update the production job during production several times. Next, in step 127, when production is determined to be complete, the program ends.

In a first embodiment described above, optimization processing computer 61, before starting production, at a point at which optimization processing has been performed on the production job to a certain extent, sends the production job for which optimization is incomplete to each of the component mounters 12 and starts production, continues optimization processing of the production job after production has started, then, sends an updated production job for which optimization has progressed during production to each of the component mounters 12 so as to update the production job being executed by each of the component mounters 12, causes automatic exchanging device 26 to operate so as to change the feeder arrangement of each of the component mounters 12 to the feeder arrangement specified in the production job, then continues production. Accordingly, by starting production using a production job for which optimization is incomplete without waiting for optimization processing of the production job to complete, production is started earlier, then, by updating to the latest production for which optimization has progressed during production and then continuing production, the production efficiency is improved during production, leading to a decrease in the production time, thereby enabling both demands of starting production early and of shortening production time to be satisfied at the same time.

Second Embodiment

Next, a second embodiment will be described with reference to FIGS. 1 to 8. However, for portions which are effectively the same as in the first embodiment, the same symbols will be assigned and description will be omitted or simplified, and description will mainly be given of different portions.

For example, during production, there are cases in which an operating condition of a specific component mounter 12 in component mounting line 10 changes such as due to pickup conditions changing due to a pickup rate of the specific component being bad, or such as slowing down a transport speed of a component because of a problem with the transport weight of a component picked up by a suction nozzle, and in such cases the tact time for that specified component mounter 12 worsens, which destroys the line balance, thereby lowering productivity and increasing production time.

Figure 9:
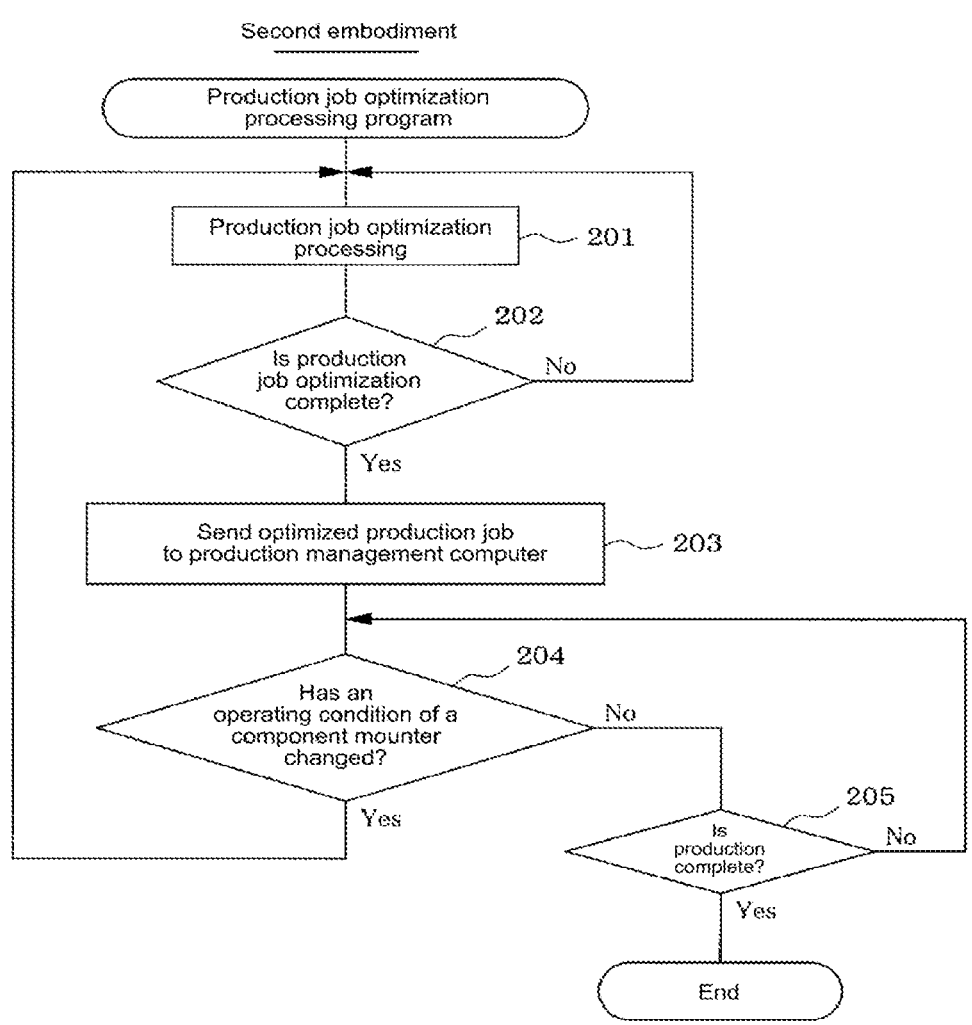
FIG. 9 is a flowchart showing a flow of processing of a production job optimization program of a second embodiment.
Figure 10:
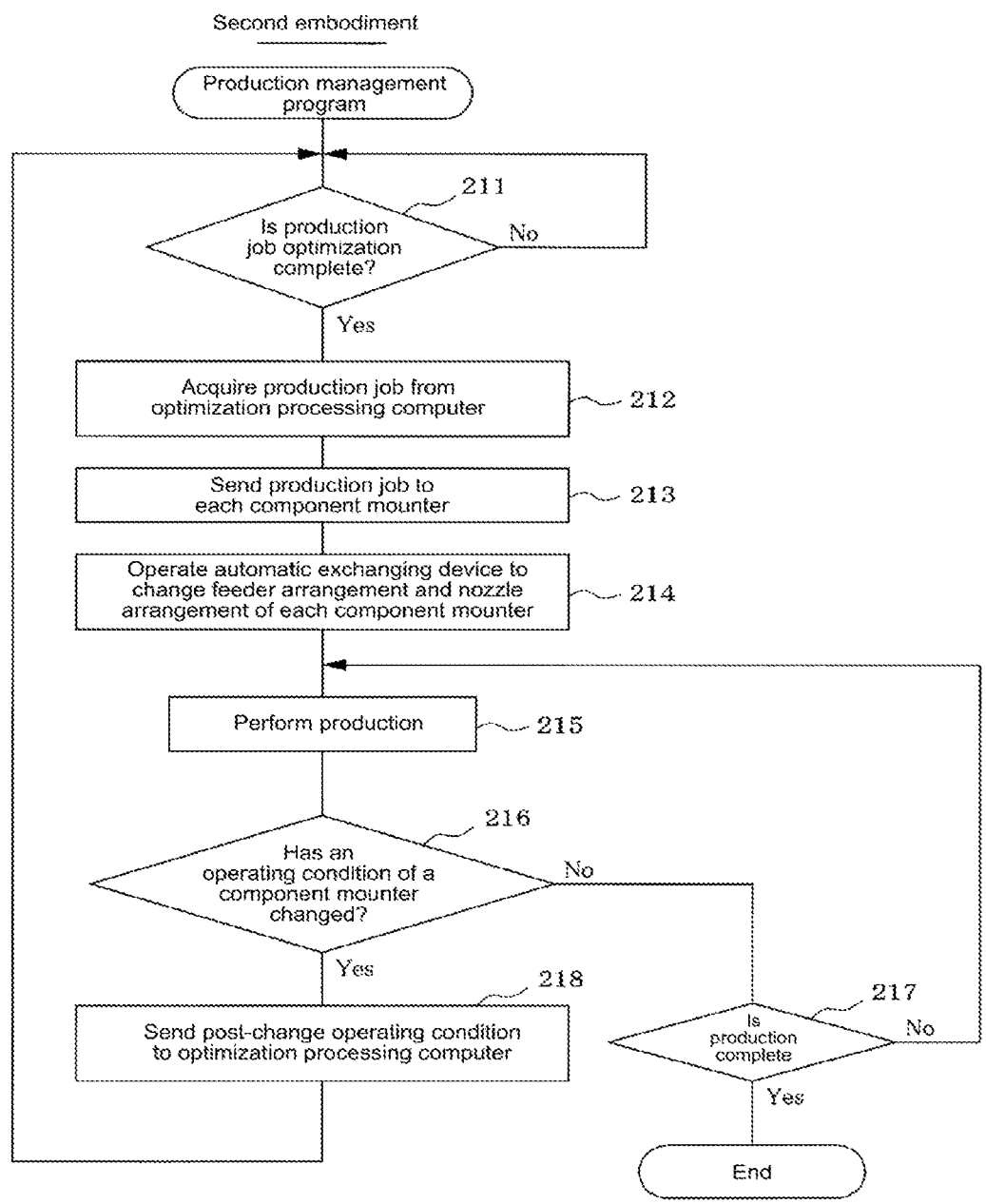
FIG. 10 is a flowchart showing a flow of processing of a production management program of the second embodiment.

Thus, in the second embodiment, optimization processing computer 61 performs the production job optimizing processing of FIG. 9 and production management computer 70 performs the production management program of FIG. 10 so as to perform the following control.

Production management computer 70 acquires the production job on which optimization processing computer 61 performed optimization processing before production was started, sends the production job to each component mounter 12, causes automatic exchanging device 26 to operate so as to change the feeder arrangement and suction nozzle arrangement of each component mounter 12 to arrangements specified in the production job, then causes each component mounter 12 to operate so as to start production. Further, production management computer 70, in a case in which an operating condition of a component mounter 12 is determined to have changed based on monitoring of the operating states of each component mounter 12 during production, the post-change operating condition is sent to optimization processing computer 61.

Then, optimization processing computer 61 performs optimization processing of the production job using the post-change operation condition acquired from production management computer 70 and sends the optimized production job to production management computer 70.

Then, production management computer 70 sends the production job acquired from optimization processing computer 61 to each component mounter 12, updates the production job being executed by each component mounter 12, causes automatic exchanging device 26 to operate so as to change the feeder arrangement and the suction nozzle arrangement of each component mounter 12 to arrangements specified in the production job, then continues production.

Next, the processing of the production job optimization processing program of FIG. 9 performed by optimization processing computer 61 will be described. The production job optimization processing program of FIG. 9 is started before production starts, and continues until production is complete.

When the production job optimization processing program of FIG. 9 is started, first, in step 201, optimization processing of the production is performed, then, in step 202, it is determined whether optimization of the production job is complete. Here, an operator may look at the degree of progress of optimization of the production job displayed on display device 63, and when the degree of progress reaches a point at which the operator determines that production can be started, the operator uses device 62 to end production job optimization processing; alternatively, before production, an operator may set a target value for the degree of progress of optimization, and when the degree of progress of optimization of the production job reaches the target value, optimization processing of the production job may be ended automatically.

In step 202, production job optimization processing is continued until it is determined that production job optimization processing is complete. Then, in step 202, upon determining that production job optimization processing is complete, proceeding to step 203, the optimized production job is sent to production management computer 70 and production is started.

Then, proceeding to step 204, it is determined whether an operating condition of a component mounter 12 has changed (that is, it is determined whether a post-change operating condition has been sent from production management computer 70), and if the operating conditions of component mounters 12 have not changed, proceeding to step 205, it is determined whether production is complete, and if production is incomplete, processing returns to step 204. Thus, processing stands by during production until an operating condition of component mounter 12 changes.

Then, in step 204, upon determining that an operating condition of a component mounter 12 has changed, processing returns to step 201, optimization processing of the production job is performed using the post-change operating condition acquired from production management computer 70, and when optimization processing is complete, the optimized production job is sent to production management computer 70 (steps 202 to 203). Thus, the production job being executed by each component mounter 12 is updated and production continues, with processing standing by during production until an operating condition of component mounter 12 changes (steps 204 to 205). According to such processing, each time an operating condition of a component mounter 12 changes during production, optimization processing of the production job is performed using the post-change operating condition, and the production job being executed by each component mounter 12 is updated. Next, in step 205, when production is determined to be complete, the program ends.

Next, the processing of production management program of FIG. 10 performed by production management computer 70 will be described. The production management program of FIG. 10 is started before production is started, and first, in step 121, similar to the method of step 103 of FIG. 7, it is determined whether there has been a production start request and processing stands by until the system determines that there has been a production start request. Then, in step 211, when it is determined that optimization of the production job is complete, proceeding to step 212, the optimized production job is acquired from optimization processing computer 61, then, proceeding to step 213, the optimized production job is sent to each component mounter 12, then, continuing to step 214, automatic exchanging device 26 is operated to change the feeder arrangement and the suction nozzle arrangement of each component mounter 12 to arrangements specified in the production job, then each component mounter 12 is operated to start production (step 215).

During production, in step 216, operating states of component mounters 12 are monitored, it is determined that an operating condition of a component mounter has changed, and if an operating condition of a component mounter has changed, proceeding to step 217, it is determined whether production is complete, and if production is incomplete, processing returns to step 215 and production continues.

Next, in step 216, upon determining that an operating condition of a component mounter 1 has changed, proceeding to step 218, the post-change operating condition is sent to optimization processing computer 61 and processing returns to step 211. Then, optimization processing computer 61 performs optimization processing on the production job using the acquired post-change operating condition, and when the optimization processing is complete, the production job optimized using the post-change operating conditions is acquired from optimization processing computer 61, that production job is sent to each component mounter 12, then each component mounter 12 updates the production job being executed, automatic exchanging device 26 is operated so as to change the feeder arrangement and the suction nozzle arrangement of each component mounter 12 to arrangements specified in the production job, then production is continued (steps 211 to 215). Accordingly, each time an operating condition of a component mounter 12 changes during production, optimization processing of the production job is performed using the post-change operating condition, and the production job being executed by each component mounter 12 is updated. Next, in step 217, when production is determined to be complete, the program ends.

With the second embodiment described above, even in a case in which an operating condition of a component mounter 12 changes during production, optimization processing of the production job is performed using the post-change operating condition by optimization processing computer 61, the optimized production job is sent to each component mounter 12 such that the production job is updated, thus, even in a case in which an operating condition of a component mounter 12 changes during production, the line balance is not destroyed, and production efficiency does not worsen.

Note that, the second embodiment may be performed in combination with the first embodiment. That is, each time an operating condition of a component mounter 12 changes during production using the first embodiment (while optimization processing is continuing), optimization processing of the production job may be performed using the post-change operating condition such that the production job being executed by each component mounter 12 is updated.

Also, in the first and second embodiments, both the feeder arrangement and the suction nozzle arrangement are changed by automatic exchanging device 26, but the configuration may be such that only the feeder arrangement is changed.

Otherwise, the present disclosure is not limited to the above embodiments, and it goes without saying that various changes and modifications can be made without departing from the gist of the present disclosure, such as changing the configuration of component mounting line 10, changing the configuration of automatic exchanging device 26, changing the configuration of feeder 14 or suction nozzle exchanging unit 81, or integrating production management computer 70 together with optimization processing computer 61, such that production management computer 70 performs the production job optimization processing programs of FIGS. 7 and 9 to optimize the production job.

REFERENCE SIGNS LIST

10: component mounting line;
11: circuit board;
12: component mounter;
14: cassette-type feeder;
15: mounting head;
16: head moving device;
19: storage device;
20: control device of component mounter;
24: feeder setting section;
26: automatic exchanging device;
27: control device of automatic exchanging device;
61: optimization processing computer (production job optimization device);
63: display device;
70: production management computer (production management device);
71: stock section;
81: cassette-type suction nozzle exchanging unit;
87: suction nozzle

The invention claimed is:

1. A component mounting line production management system for a component mounting line configured to produce component-mounted boards using multiple component mounters arranged along a conveyance path on which a circuit board is conveyed, the component mounters picking up a component supplied from a feeder using a suction nozzle and mounting the component on the circuit board, the system comprising:

a production job optimization device configured to perform processing to optimize a production job executed by each of the component mounters in the component mounting line;

an automatic exchanging device configured to automatically exchange feeders set on each of the component mounters in accordance with a feeder arrangement specified in the production job; and a production management device configured to acquire the production job on which optimization processing was performed by the production job optimization device, send the production job to each of the component mounters, and cause the automatic exchanging device to operate so as to change the feeder arrangement of each of the component mounters to the feeder arrangement specified in the sent production job and then cause each of the component mounters to operate, wherein the production management device is configured to acquire a production job for which optimization is incomplete from the production job optimization device before starting production, send the production job for which optimization is incomplete to each of the component mounters, and start production with the feeder arrangement specified in the production job for which optimization is incomplete, the production job optimization device is configured to continue optimization processing of the production job after production has been started, and the production management device is configured to acquire a latest production job for which optimization has progressed during production from the production job optimization device during production, update the production job being executed at each of the component mounters, cause the automatic exchanging device to operate so as to change the feeder arrangement of each of the component mounters to the feeder arrangement specified in the latest production job, then continue production.

2. The component mounting line production management system according to claim 1, wherein each of the component mounters is configured to exchangeably hold the suction nozzle, includes a suction nozzle exchanging unit, which houses exchange-use suction nozzles in a removable manner, next to the feeders, and performs automatic exchange of the suction nozzle to and from the suction nozzle exchanging unit in accordance with a suction nozzle arrangement specified in the production job, and the automatic exchanging device is configured to perform automatic exchange of the feeders and the suction nozzle exchanging units set in each of the component mounters in accordance with the feeder arrangement and the suction nozzle arrangement specified in the production job.

3. The component mounting line production management system according to claim 1, wherein the production job optimization device is configured to calculate information related to a production efficiency improvement result and display the result on a display device when the production job has been updated to the latest production job based on a degree of progress of optimization of the production job after production has been started.

4. The component mounting line production management system according to claim 1, wherein the timing to update the production job being executed by each of the component mounters is determined by an operator based on the degree of progress of the optimization processing of the production job of the production job optimization device after production has been started, and the production job optimization device is configured to, when the operator has performed operation to update the production job, send the production job optimized to that point to the production management device.

5. The component mounting line production management system according to claim 1, wherein the production job optimization device is configured to determine the timing to update the production job being executed by each of the component mounters based on the degree of progress of the optimization processing of the production job of the production job optimization device after production has been started, and send the production job optimized to that point to the production management device.

6. The component mounting line production management system according to claim 1, wherein the production management device is configured to monitor an operating state of each of the component mounters during production, and in a case in which an operating condition of any of the component mounters has changed, to send the post-change operating condition to the production job optimization device, the production job optimization device is configured to perform optimization processing of the production job using the acquired post-change operating condition, and the production management device is configured to acquire the production job optimized using the post-change operating condition from the production job optimization device during production and update the production job being executed by each of the component mounters.

7. A component mounting line production management method for a component mounting line configured to produce component-mounted boards using multiple component mounters arranged along a conveyance path on which a circuit board is conveyed, the component mounters picking up a component supplied from a feeder using a suction nozzle and mounting the component on the circuit board, the method comprising:

using a production job optimization device configured to perform processing to optimize a production job executed by each of the component mounters in the component mounting line, and an automatic exchanging device configured to automatically exchange feeders set on each of the component mounters in accordance with a feeder arrangement specified in the production job;

acquiring the production job on which optimization processing was performed by the production job optimization device, sending the production job to each of the component mounters, causing the automatic exchanging device to operate so as to change the feeder arrangement of each of the component mounters to the feeder arrangement specified in the sent production job and then causing each of the component mounters to operate so as to start production continuing optimization processing of the production job after production has been started, and acquiring a latest production job for which optimization has progressed during production from the production job optimization device during production, updating the production job being executed at each of the component mounters, causing the automatic exchanging device to operate so as to change the feeder arrangement of each of the component mounters to the feeder arrangement specified in the latest production job, then continuing production.

* * * * *